United States Patent [19]

Chu

[11] Patent Number: 5,061,973

[45] Date of Patent: Oct. 29, 1991

[54] SEMICONDUCTOR HETEROJUNCTION DEVICE WITH GRADED BANDGAP

[75] Inventor: Tak-Kin Chu, Bethesda, Md.

[73] Assignee: The United States of America as represented by the Secretary of the Navy, Washington, D.C.

[21] Appl. No.: 517,013

[22] Filed: Apr. 27, 1990

[51] Int. Cl.⁵ .................. H01L 29/161; H01L 29/205; H01L 29/225; H01L 29/20

[52] U.S. Cl. .......................................... 357/16; 357/61

[58] Field of Search ............................... 357/16, 62, 61

[56] References Cited

U.S. PATENT DOCUMENTS

| 4,568,958 | 2/1986 | Baliga | 357/23.4 |
|---|---|---|---|
| 4,568,959 | 2/1986 | Chang et al. | 357/30 |
| 4,639,756 | 1/1987 | Rosbeck et al. | 357/30 |
| 4,719,155 | 1/1988 | Matsumoto | 428/700 |
| 4,753,684 | 6/1988 | Ondris et al. | 136/258 |
| 4,768,074 | 8/1988 | Yoshida et al. | 357/34 |
| 4,769,341 | 9/1988 | Luryi | 437/106 |
| 4,914,494 | 4/1990 | Webb | 357/16 |

Primary Examiner—Andrew J. James
Assistant Examiner—Stephen D. Meier
Attorney, Agent, or Firm—Kenneth E. Walden; Jacob Shuster

[57] ABSTRACT

The semiconductor materials of junction forming layers of a heterojunction structure are interfaced by a gap region that is graded by degree of alloying of those components of an interfacing material which are respectively compounded in the semiconductor materials of the junction forming layers having different bandgaps and band edges that are aligned by the grading of the interfacing gap region to selectively control rectifying junction characteristics.

2 Claims, 1 Drawing Sheet

SEMICONDUCTOR HETEROJUNCTION DEVICE WITH GRADED BANDGAP

BACKGROUND OF THE INVENTION

This invention relates generally to rectifying junction types of semiconductor devices and more particularly to a heterojunction structure with a grade gap region at its interface.

Semiconductor rectifying junction devices are widely utilized in electronic and electro-optic installations, including by way of example infrared photovoltaic detectors. The most commonly utilized semiconductor devices are of the p-n junction and Schottky junction types. In the p-n junction device, p-type and n-type classes of materials are deposited on each other and arranged to minimize migration of dopants across the junction. The Schottky junction device on the other hand, relies on the judicious choice of contact metals and is dependent on the semiconductor material utilized and the type of charge carrier involved to establish the rectifying junction characteristics. Formation of such Schottky junction devices by available fabrication processes are accordingly not always as reilable as desired, especially where small bandgaps are involved.

The fabrication of multilayered semiconductor devices, including three layers deposited in stacked relation on a substrate, is generally well known as disclosed for example in U.S. Pat. Nos. 4,297,717, 4,686,550, 4,748,484, 4,763,176 and 4,853,581 to Li, Capasso et al., Takakuwa et al., Ito and Kuroda et al. The design of such semiconductor devices with the cap layer having the wider bandgap is furthermore disclosed in the Li patent while according to the ITO patent the barrier height characteristic of the junction may be controlled by the degree of alloying of electrode material associated with a multilayered semiconductor type of photodetector.

In connection with multilayered semiconductor devices, the misalignment between bandedges of adjacent layers usually arises where the bandgaps of such layers are not of the same magnitude especially in p-n junction types of semiconductor devices where the layers are respectively made of n-type materials. In the case of blocking semiconductor metal or Schottky junction types of band structures, the blocking potential is created by bending of the associated energy band when the electrode metal is brought into contact with its semiconductor layer. Such prior art semiconductor arrangements often impose burdensome constraints on the design of rectifying junctions because of junction characteristics and other properties thereof.

It is therefore an important object of the present invention to provide a structural arrangement and method of fabricating a heterojunction type of semiconductor device through which greater design flexibility may be practiced in controlling its rectifying junction characteristics and properties.

SUMMARY OF THE INVENTION

In accordance with the present invention a heterojunction semiconductor device includes two layers made of the same class of p-type or n-type of semiconductor materials to form a rectifying junction, with one of the layers deposited on the substrate having a narrow bandgap while the other layer has a wide bandgap. Bandedge alignment between the two junction forming layers is established by formation of continuous edge changing alignment bands between which an interfacing bandgap region is defined, graded by selective control of the degree of alloying of interfacing material therein. The interfacing material is an alloy compound of different components of the semiconductor materials from which the two junction forming layers are made. All of such junction forming and interfacing materials are interrelated by a common material component with the other material components of the interfacing bandgap region being alloyed to a variable degree within limits, thereby achieving the desired grading of such region.

BRIEF DESCRIPTION OF THE DRAWING FIGURES

Other objects, advantages and novel features of the invention will become apparent from the following detailed description of the invention when considered in conjunction with the accompanying drawing wherein:

FIG. 1 is a partial side section view of a semiconductor heterojunction structure in accordance with one embodiment of the invention.

FIG. 2 is a conduction energy band diagram associated with the structure depicted in FIG. 1. For simplicity, only a p-type structure is depicted. A structure based on n-type semiconductor can be constructed in a similar manner.

DETAILED DESCRIPTION OF THE PREFERRED EMBODIMENTS

Figure 1:
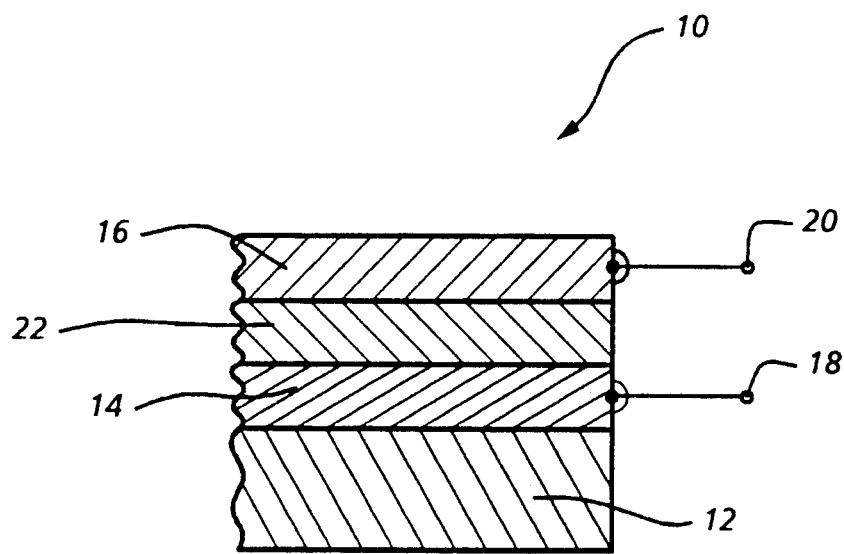

Referring now to the drawing in detail, FIG. 1 illsutrates a typical semiconductor device 10 constructed in accordance with an embodiment of the present invention. The device 10 includes a substrate 12 on which a layer 14 made of a semiconductor compound material is deposited underlying a cap layer 16 that is light absorbing for photo voltaic detection purposes. The layers 14 and 16 are made of a different but structurally and chemically similar semiconductor compound material within the same p-type or n-type conductivity class. By way of example, layer 14 could be made of a compound of mercury and tellurium (HgTe) while the layer 16 is made of a coumpound of cadmium and tellurium (CdTe). A p-type junction is thereby established across such layers through terminals 18 and 20 as shown. Other semiconductor compounds may be used for layers 14 and 16, such as lead selenium (PbSe) for layer 14 and tin selenium (SnSe) for layer 16. It will be apparent from the foregoing examples that the semiconductor compound materials for the respective layers fall within chemical classes denoted as (AC) and (BC) with a common atomic element (C) and different atomic elements (A) and (B).

In accordance with the present invention, an intermediate layer 22 is interfaced between the heterojunction forming layers 14 and 16 in stacked relation to the substrate 12. The interfacing layer 22 is made of an alloy compound of the elements (A), (B) and (C) thereby chemically related to the aforementioned semiconductor compounds (AC) and (BC) forming the respective heterjunction layers 14 and 16 in order to effect band edge alignment between such layers 14 and 16 which do not otherwise line up because of differences in magnitude of the associated band gaps. In the example described herein, the alloy compound of layer 22 is schematically denoted as $(A_{1-x}B_xC)$, where X is a continuously variable and controllable parameter determining the degree of alloying. Obviously, the value X falls between zero (0) and one (1).

An important aspect of the present invention resides in the bandgap grading of the layer 22 by selection of the degree of alloying through the variable X within a limited range between zero and one ($0 \leq X \leq 1$) to meet different requirements afforded by rectifying junction characteristics. For example, one of such cahracteristics for the p-type junction relates to blocking potential or barrier height for hole conduction across the junction. Blocking potential depends on band edge alignment between layers 14 and 16 in accordance with the present invention, in contrast to the blocking potential characteristic heretofore created by energy bending between semiconductor layers resulting from layer metal contact of a Schottky type junction.

Figure 2:
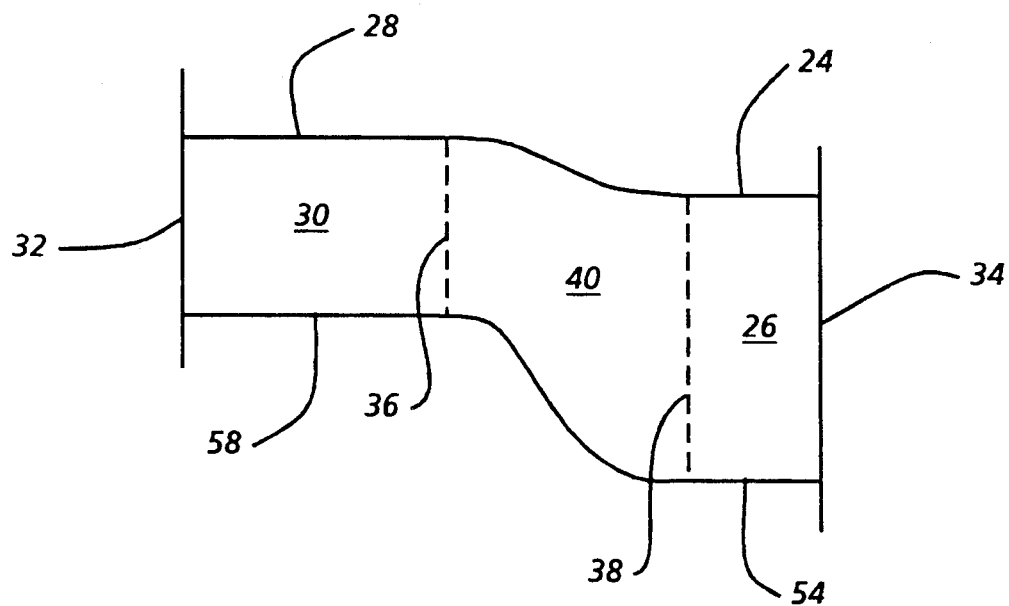

The foregoing band edge alignment referred to in connection with the present invention is depicted in the semiconductor conduction energy band diagram of FIG. 2, wherein the conduction band edge 24 along the wider bandgap region 26 established by layer 16 is lower than the conduction band edge 28 along the narrow bandgap region 30 established by layer 14. The narrow and wide bandgap regions 30 and 26 respectively extend from the substrate interface 32 and the junction contact interface 34, as depicted in FIG. 2, toward spaced interfaces 36 and 38 between which a graded bandgap region 40 is by the intermediate layer 22 in order to achieve alignment between band edges 24 and 28.

The junction rectifying characteristics of blocking potential height involves a built-in electric field making it desirable to have a conduction band edge 24 for region 26 as low as possible and a bandgap much larger than that of region 30 to obtain stronger junction rectification. It is also desirable to have a conduction band edge 24 for region 26 higher than the valence band edge 58 of layer 14 with valence band edge 54 being lower than band edge 58 as shown in FIG. 2 in order to reduce or prevent carrier tunneling between layers 14 and 16 and the consequential degradation of the rectifying capability of the p-type junction. In an n-type structure, the valence band edges 54 and 58 should be aligned so that 54 is higher than 58, but lower than 28.

Also in acocrdance with the present invention the actual width of the graded gap region 40 established by intermediate layer 22 affects the rectifying characteristics of the junction and other properties thereof such as capacitance. Flexibility in the design and engineering of the rectifying junction is thereby enhanced by the availability of width as a selective control parameter in accordance with the present invention in sharp contrast to the design of p-n and Schottky types of junctions wherein width is dictated by carrier densities and energy band gap. The continuously varying width parameter of the graded gap region 40 associated with the semiconductor junction device of the present invention may be readily controlled through its fabrication process.

The fabrication process according to one embodiment utilizes standard semiconductor deposition techniques, such as molecular beam epitaxy and metallo-organic vapor deposition, through which the layers 14, 22 and 16 are sequentially deposited in stacked relation onto the substrate 12. Sufch fabrication method involves creation of the graded gap region 40 by selective control of the degree of alloying of the separately deposited layer 22. According to another embodiment, the graded gap region 40 is created after initial establishment of an abrupt heterojunction structure through layers 14 and 16 by use of an annealing process. In the latter case, grading of region 40 is achieved by inter-diffusion of the alloying elements (A) and (B) with the common compound material component (C) of layers 14 and 16 in accordance with the relationships hereinbefore described.

Numerous other modifications and variations of the present invention are possible in light of the foregoing teachings. It is therefore to be understood that within the scope of the appended claims the invention may be practiced otherwise than as specifically described.

What is claimed is:

1. In a converter of radiation to electrical signals employing two regions of semiconductor material forming wide and narrow bandgaps, said two regions being of the same conductivity type and having conduction and valence band edges between which abrupt steps exist to define said wide and narrow bandgaps, the improvement residing in: an intermediate region in interfacing abutment with said two regions and made of an alloy material interrelated with the semiconductor material of the two regions to establish alignment bands respectively bridging the conduction and valence band edges of the two regions, said alignment bands defining a graded bandgap of continuously varying width, between the band edges within the intermediate region.

2. The improvement as defined in claim 1 wherein the conduction annd valence band edges between which the wide bandgap is defined are respectively lower than the conduction and valence bandedges between which the narrow bandgap is defined, both of the alignment bands varying continuously in the same direction from the wide bandgap to the narrow bandgap where the semiconductor material of the two regions is in a n-type junction class.

* * * * *